United States Patent
Gonring

(10) Patent No.: US 7,218,118 B1
(45) Date of Patent: May 15, 2007

(54) METHOD FOR MONITORING A CONDITION OF A BATTERY

(75) Inventor: Steven J. Gonring, Slinger, WI (US)

(73) Assignee: Brunswick Corporation, Lake Forest, IL (US)

( * ) Notice: Subject to any disclaimer, the term of this patent is extended or adjusted under 35 U.S.C. 154(b) by 325 days.

(21) Appl. No.: 10/822,584

(22) Filed: Apr. 12, 2004

(51) Int. Cl.
*G01N 27/416* (2006.01)
*H02J 7/00* (2006.01)

(52) U.S. Cl. .................. 324/429; 320/128; 320/132

(58) Field of Classification Search ............. 320/132, 320/133, 127; 324/429, 425, 432; 307/10.1, 307/10.6, 10.7
See application file for complete search history.

(56) References Cited

U.S. PATENT DOCUMENTS

| 5,623,197 | A | 4/1997 | Roseman et al. ............. 320/61 |
| 5,969,529 | A | 10/1999 | Eiraku et al. ................ 324/433 |
| 6,273,771 | B1 | 8/2001 | Buckley et al. ............... 440/84 |
| 6,424,157 | B1 * | 7/2002 | Gollomp et al. ............. 324/430 |
| 6,459,170 | B1 | 10/2002 | Tamai et al. .................. 307/48 |
| 6,628,107 | B1 | 9/2003 | Bang et al. ................. 323/266 |
| 6,675,912 | B2 | 1/2004 | Carrier ....................... 173/217 |
| 2004/0130296 | A1 * | 7/2004 | Gross et al. ................ 320/133 |

OTHER PUBLICATIONS

"Programmable Current Sensing High-Side Switching IR3310/11/12" by the International Rectifier Company, pp. 1-9, Application Note, AN-1058.
"Research Drives Battery Health", University of Wisconsin-Madison, College of Engineering, *Perspective*, vol. 26, Winter 2000, pp. 1-2.

* cited by examiner

*Primary Examiner*—Pia Tibbits
*Assistant Examiner*—Richard V. Muralidar
(74) *Attorney, Agent, or Firm*—William D. Lanyi

(57) ABSTRACT

A method for monitoring the condition of a battery of a marine propulsion system provides the measuring of a voltage characteristic of the battery, comparing the voltage characteristic to a preselected threshold value, and evaluating the condition of the battery as a function of the relative magnitudes of the voltage characteristic and the threshold value. The voltage characteristic of the battery is measured subsequent to a connection event when a connection relationship between the battery and an electrical load is changed. The electrical load is typically a starter motor which is connected in torque transmitting relation with an internal combustion engine. The voltage characteristic is preferably measured at its minimum value during the inrush current episode immediately prior to cranking the internal combustion engine shaft to start the engine.

5 Claims, 4 Drawing Sheets

METHOD FOR MONITORING A CONDITION OF A BATTERY

BACKGROUND OF THE INVENTION

1. Field of the Invention

The present invention is generally related to a method for monitoring the condition of an electrical storage battery and, more particularly, to a method for determining the level of operability of an electrical storage battery that is connectable in electrical communication with a starter motor associated with an internal combustion engine.

2. Description of the Prior Art

Batteries are used to provide power in many different systems that are well known to those skilled in the art. In most systems, the battery is periodically checked by measuring the nominal system voltage across the battery terminals with either no load connected to the battery or a constant load connected to the battery. This type of test can identify certain battery failure modes, but is unable to detect many other likely fault conditions relating to the battery.

U.S. Pat. No. 6,273,771, which issued to Buckley et al. on Aug. 14, 2001, discloses a control system for a marine vessel. The control system incorporates a marine propulsion system that can be attached to a marine vessel and connected in signal communication with a serial communication bus and a controller. A plurality of input devices and output devices are also connected in signal communication with a communication bus and a bus access manager, such as a CAN Kingdom network, is connected in signal communication with the controller to regulate the incorporation of additional devices to the plurality of devices in signal communication with the bus, whereby the controller is connected in signal communication with each of the plurality of devices on the communication bus. The input and output devices can each transmit messages to the serial communication bus for receipt by other devices.

U.S. Pat. No. 6,675,912, which issued to Carrier on Jan. 13, 2004, describes a dual-mode non-isolated corded system for transportable cordless power tools. The dual-mode system for inexpensively operating electrically powered double-insulated devices, such as hand-held power tools and appliances is described. A voltage converter includes an inrush current limiter and power conditioner for filtering AC or DC input power. The filtered voltage is chopped by a transformerless buck-derived converter. The chopped voltage is rectified and filtered to provide low-voltage DC power to the drive motor of the powered double-insulated device.

U.S. Pat. No. 6,459,170, which issued to Tamai et al. on Oct. 1, 2002, describes an on-board electric power supply system. A central processing unit captures an on control signal for low-voltage loads in LAN multiplex transmission, controls low-voltage switching devices to be turned on in order to supply a power to the low-voltage loads, and performs a DC supply from a low-voltage battery to the low-voltage loads. In this case, immediately after an on control signal for the low-voltage loads is captured, the CPU controls a voltage converter which is not operating, so as to be activated, thereby performing a DC supply to the low-voltage battery and the low-voltage loads.

U.S. Pat. No. 6,628,107, which issued to Bang et al. on Sep. 30, 2003, describes a power management system for a portable electronic device. A system for a supplemental power source for a handheld portable electronic device is provided. A super capacitor is connected in parallel to a main battery of the portable electronic device. When the main battery becomes disconnected, the super capacitor is used to power the portable electronic device. The super capacitor is also used to provide compensation for the internal impedance of the main battery and the path impedance between the main battery and the load.

U.S. Pat. No. 5,623,197, which issued to Roseman et al. on Apr. 22, 1997, describes an active control of battery charging profile by generator control unit. A system for actively controlling the charging profile of a battery uses a software-based generator control unit to control the charging voltage. The voltage may be initially reduced following battery discharge to prevent large current inrush transients. The voltage may then be raised above a normal charging level to increase the battery charging rate. The control system provides better control over battery charging and prevents overheating of the battery and generator and allows the battery to be recharged more quickly.

U.S. Pat. No. 5,969,529, which issued Eiraku et al. on Oct. 19, 1999, describes an electronic apparatus having battery power source. A voltage monitoring circuit detects when the output battery of a power source falls below a predetermined reference voltage. A controller, in response to the monitoring circuit, performs a load operation. In the load operation, a switch in a pseudo-load circuit is operated to connect a dummy load. On the basis of the output voltage of the power source when the dummy load is operable, the controller determines whether to allow further drain on the power supply (e.g. connection of a peripheral device interface). In one embodiment, the pseudo-load circuit has plural dummy loads which can be invoked to determine with which of plural possible loads the power source can be utilized. Also disclosed are both digital and analog methods and circuits for determining utilizable load magnitude by gradually raising power supply capacity. The invention solves numerous problems, including combating an inrush current which can be produced when a card is inserted into an electronic apparatus such as a personal digital assistant.

The patents described above are hereby expressly incorporated by reference in the description of the present invention.

An application note, provided by the International Rectifier Company, which is titled "Programmable Current Sensing High-Side Switch IR3310/11/12", describes reverse battery protection used in conjunction with the switch. Among other subjects, it considers potential damage to various components such as batteries.

In Volume 26 of "Perspective" for the winter of 2000, the College of Engineering of the University of Wisconsin at Madison published an article titled "Research Drives Battery Health." In this article, a research project is described in which various parameters relating to a battery are monitored.

When batteries are used as a power source for a starter of an internal combustion engine, the loss of use of the battery results in the inability to operate the vehicle. If this occurs in an automobile, the operator of the automobile is required to contact a service supplier or other type of assistance to allow the automobile to be repaired or started. When this occurs in a marine vessel, the operator of the marine vessel may be far from land and unable to quickly summon assistance. Therefore, it would be significantly beneficial if a system could be developed which allows battery failure to be predicted in advance so that repair or replacement of the battery can be arranged at the convenience of the marine vessel operator. It would also be significantly beneficial if the condition of the battery could be evaluated without additional equipment and components having to be provided.

SUMMARY OF THE INVENTION

A method for monitoring a condition of a battery which is connectable to an electrical load, in accordance with a preferred embodiment of the present invention, comprises the steps of measuring a voltage characteristic of the battery during a measuring event which is subsequent to a connection event when a connection relationship between the battery and the electrical load is changed, comparing the voltage characteristic to a preselected threshold value, and evaluating the condition of the battery as a function of a relative magnitude of the voltage characteristic and the threshold value.

The voltage characteristic can be a minimum voltage magnitude which occurs subsequent to the connection event. The characteristic can also be a voltage magnitude measured at a predetermined time subsequent to the connection event. The voltage characteristic can be a voltage magnitude measured subsequent to a minimum voltage magnitude which, in turn, is subsequent to the connection event.

The electrical load can be a starter motor which is connected in torque transferring relation with an internal combustion engine. The present invention can further comprise the step of initiating the connection event. In some applications of the present invention, a starter motor is activated under the control of a microprocessor of an engine control unit (ECU). The microprocessor, in these applications, therefore initiates the connection event between a battery and an electrical load which is a starter motor.

In certain embodiments of the present invention, it further comprises the step of determining the occurrence of the connection event. When the connection event is not under direct control of the microprocessor in the engine control unit, the microprocessor can monitor certain characteristics to determine when the connection event actually occurs or is about to occur. This can comprise the steps of monitoring a crankshaft of the engine to detect movement or, alternatively, monitoring the voltage of the battery and detecting a decrease which is an indication of the beginning of an inrush current through the starter motor from the battery. The determining step can comprise the step of measuring a plurality of occurrences of the voltage characteristic, as described above, and determining the onset of the connection event by this plurality of occurrences. Alternatively, the determining step can comprise the step of reacting to the rotation of a rotatable shaft which can be the crankshaft of an internal combustion engine.

In certain embodiments of the present invention, the battery is connected in electrical communication with a starter motor of a marine propulsion system. The voltage characteristic of the battery can be measured across two electrodes of the battery itself or, alternatively, it can be measured across two electrical connections of the electrical load, such as the starter motor. The connection relationship is changed during the connection event, in certain embodiments of the present invention, from the electrical load being disconnected from the battery to the electrical load being connected to the battery. Therefore, the connection event is the event during which the battery is connected in electrical communication with the electrical load, such as a starter motor.

In certain embodiments of the present invention, it can further comprise the step of storing the voltage characteristic for a plurality of subsequent magnitudes of the voltage characteristic obtained during subsequent measuring events. It can also comprise the step of using the plurality of subsequent magnitudes of the voltage characteristic to calculate a trend of magnitudes of the voltage characteristic. The present invention can further comprise the step of predicting a future condition of the battery as a function of this trend.

The preselected threshold value is selected from a plurality of threshold values in a preferred embodiment of the present invention. The plurality of threshold values allows the present invention to grade the condition of the battery based on the magnitude of the voltage characteristic. Each of the plurality of threshold values would represent a distinct level of the condition of the battery.

BRIEF DESCRIPTION OF THE DRAWINGS

The present invention will be more fully and completely understood from a reading of the description of the preferred embodiment in conjunction with the drawings, in which.

DESCRIPTION OF THE PREFERRED EMBODIMENT

Figure 1:
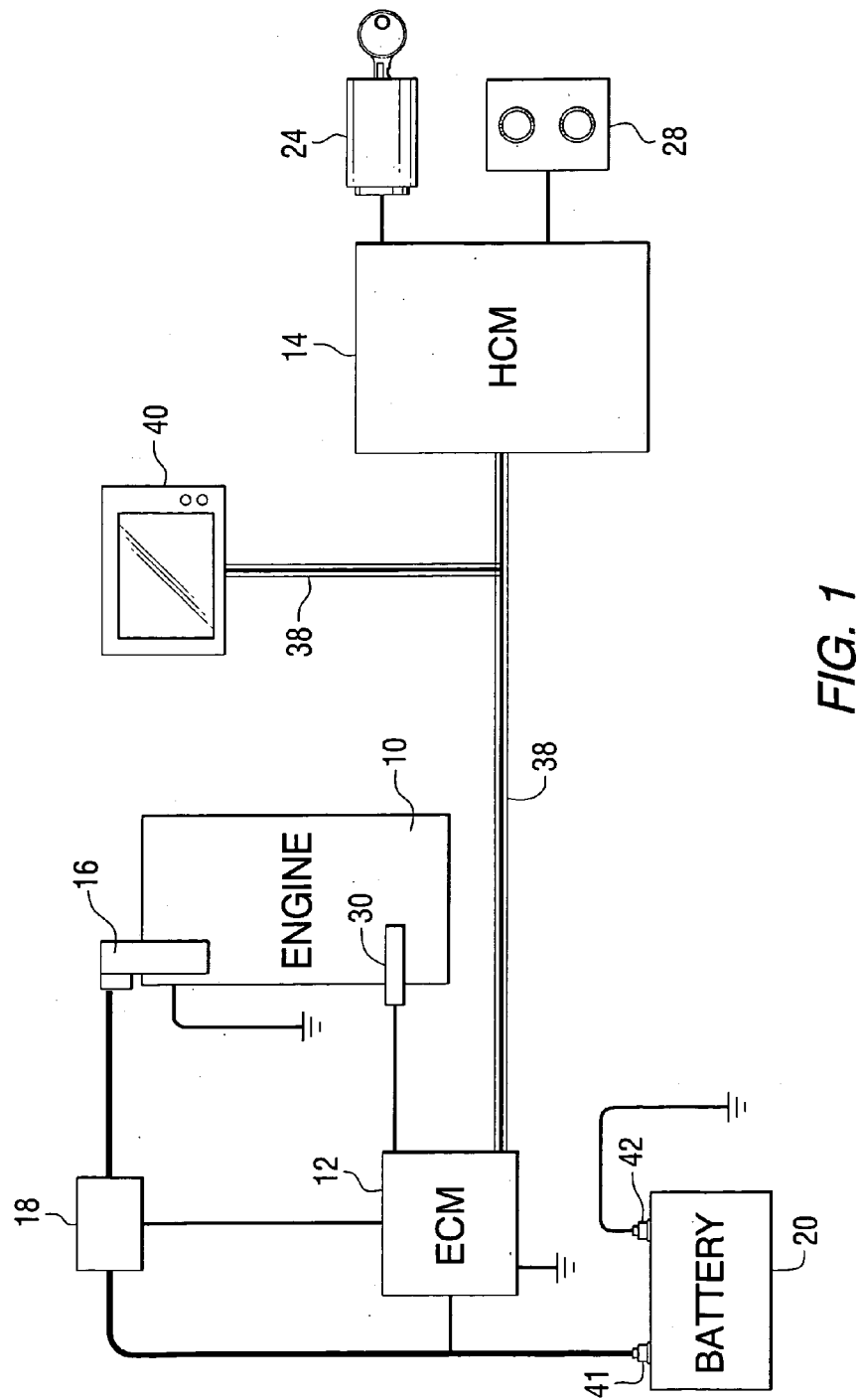
FIG. 1 is a simplified schematic representation of a marine propulsion system in which an engine control module is interjected directly into the starting procedure.

Throughout the description of the preferred embodiment of the present invention, like components will be identified by like reference numerals.

FIG. 1 is a schematic representation of a marine propulsion system that provides an engine 10, an engine control module (ECM) 12, and a helm control module (HCM) 14. The engine 10 is provided with a starter motor 16 that can be activated by a starter solenoid 18. Power is provided by a battery 20. A key switch 24 allows an operator of the marine vessel to activate a starting sequence for the engine 10. Start and stop buttons 28 can also be provided to allow the operator to control the starting and stopping of the engine 10. A crank shaft position sensor 30 is provided to allow the engine control module 12 to monitor the rotational speed of a crankshaft of the engine 10. Although the present invention will be described in terms of using a crank shaft position sensor to determine engine speed, it should be clearly understood that other components can also be used for this purpose. As an example, a tachometer can serve this purpose.

In the illustration shown in FIG. 1, the engine control module 12 and the helm control module 14 are connected to each other by a Controller Area Network (CAN) bus 38. A display device 40 is also connected to the CAN bus 38.

The purpose of the present invention is to allow the monitoring of the condition of the battery 20 on an ongoing basis without having to add components to the system shown in FIG. 1. In addition, the present invention is intended to provide more relevant diagnosis of the battery 20 than merely measuring the voltage between the terminals, 41 and 42, of the battery.

With continued reference to FIG. 1, the system illustrated is one in which the engine control module 12 controls the actual starting of the engine 10. Although the operator initiates the procedure by using the key switch 24, the engine control module 12 actually initiates the activation of the starter solenoid 18 which, in turn, energizes the starter motor 16. In contradistinction to this method of starting the engine 10, FIG. 2 is a system that allows the operator to initiate the starting of the engine 10 without intervening control by the engine control module 12.

Figure 2:
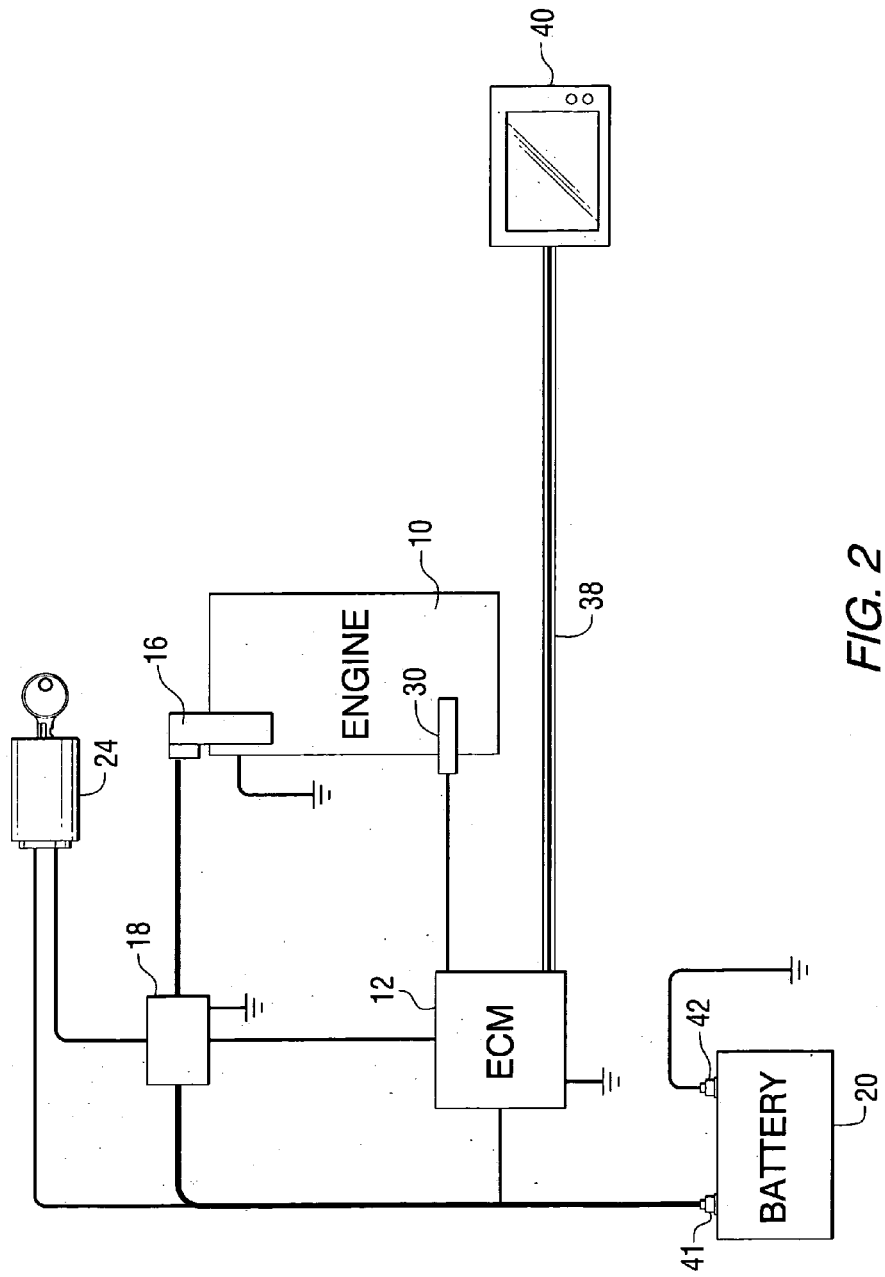
FIG. 2 is a marine propulsion system that is simpler than the one shown in FIG. 1 and in which the starting sequence is controlled by the operator of a marine vessel.

In the system shown in FIG. 2, the operator uses the key switch 24 to electrically activate the starter solenoid 18 which, in turn, energizes the starter motor 16. Unlike the system shown in FIG. 1, the engine control module 12 in FIG. 2 is not necessarily aware of the activation of the key switch 24 until it senses some changing parameter resulting from the operator's starting of the engine 10. This parameter can be a signal received from the crank shaft position sensor 30 which indicates rotation of the crankshaft or a change in voltage measured across either the terminals, 41 and 42, of the battery 20, or connections of the starter motor 16 which are connected to ground and to the starter solenoid 18.

It should be understood that the present invention can be used in conjunction with various types of electrical load that is connected to a source of electrical power. In a preferred embodiment of the present invention, this load is a starter motor. A starter motor is particularly preferred because the inrush current of a starter motor is a relatively large load which is usually consistent for any particular set of conditions, including battery conditions. For these reasons, the use of a starter motor is particularly preferred in conjunction with the present invention.

Figure 3:
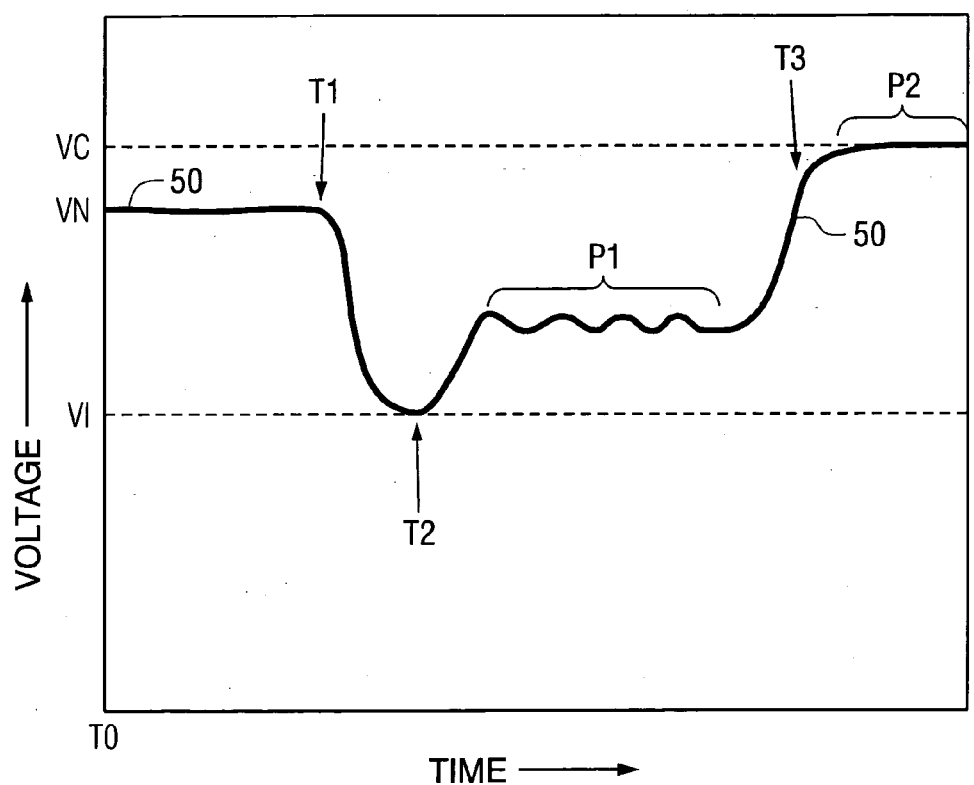
FIG. 3 is a generalized graphical representation of the voltage magnitude of a battery prior to, during, and immediately after a starting event.

In order to understand the basic concept of the present invention, it is necessary to understand how a voltage characteristic of the battery 20 changes during the activation of the starter motor 16. FIG. 3 is a highly simplified and generalized graphical representation of a battery voltage 50, shown as a function of time, during various periods of the engine starting process. For purposes of this illustration, the battery voltage 50 is shown in a quiescent state until time T1 when the starter motor 16, as described above in conjunction with FIGS. 1 and 2, is activated. Immediately after this activation at time T1, the inrush current into the starter motor is at its maximum level and the voltage 50 experiences a rapid decline, as shown between times T1 and T2. When the inrush episode is primarily completed, at time T2, the voltage 50 increases and a motor cranking period P1 begins. During the motor cranking period P1, the starter motor 16 rotates the crankshaft of the engine in an attempt to initiate a starting of the engine 10. As this cranking period P1 ends at time T3, the engine begins to run and the charging system begins to charge the battery 20 and the voltage 50 increases and remains at a charging voltage during the period P2.

The normal voltage of the battery is identified as VN in FIG. 3 and the charging voltage is identified as VC in FIG. 3. For purposes of reference, the normal voltage VN is typically 12.6 volts and the charging voltage VC, which is a function of the charging circuit, is typically about 14.2 volts. It should be understood that the example provided below is intended to explain one embodiment and the values and magnitudes used in that example are not limiting to the present invention. Other values and magnitudes could also be used.

If the battery is in good condition, the minimum voltage magnitude, occurring at time T2, is approximately 10 volts or higher. This is identified as the voltage at inrush or VI.

Figure 4:
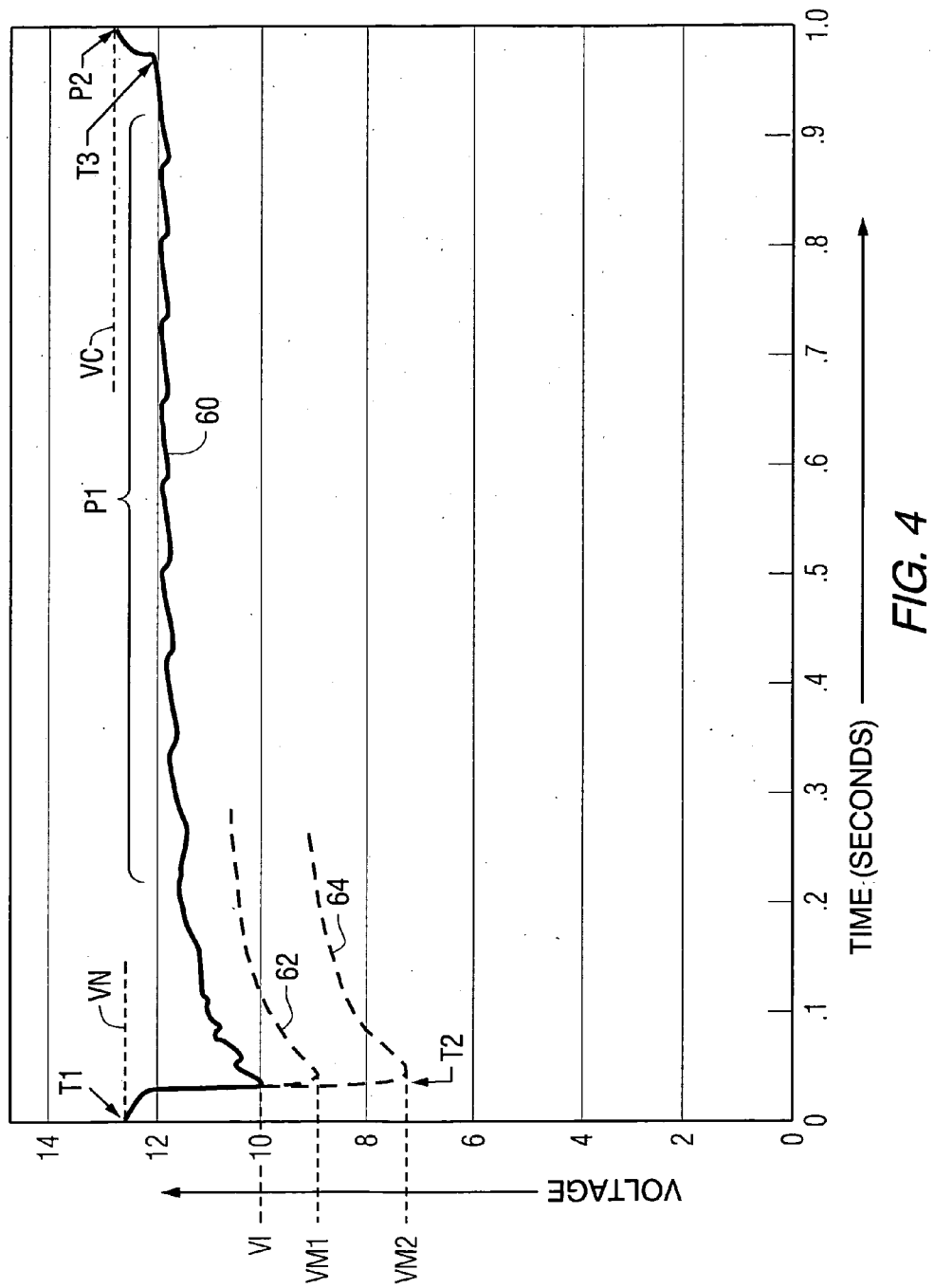
FIG. 4 is a graphical representation of empirically derived magnitudes of a battery voltage during a starting event.

FIG. 4 is a graphical representation of an actual starting sequence, showing the fluctuations in the measured magnitude of the battery voltage 60. As can be seen in FIG. 4, the battery voltage begins, at time T1, at a value VN that is approximately 12.6 volts. The battery voltage 60 then decreases rapidly to its voltage VI during inrush, at time T2, which is approximately 10 volts. The cranking period P1 occurs until the engine begins to operate on its own. At that point, which is identified as T3, the charging period P2 begins, as illustrated in FIG. 4, and the battery voltage is raised to its charging voltage VC by the charging circuit associated with the engine. It should be understood that FIG. 4 is an empirically derived graphical representation which is generally similar to the more theoretical illustration shown in FIG. 3.

With continued reference to FIG. 4, dashed lines 62 and 64 are also illustrated. These dashed lines represent the portion of the curve 60 in the time period around time T2 when the voltage VI during inrush occurs. It should be understood that dashed lines 62 and 64 represent hypothetical events and are not empirically derived. Line 62 illustrates the voltage values for a battery that is in a condition that is weaker than the condition of the battery that generated graph 60. As can be seen, the minimum value VM1 is less than the magnitude of voltage VI described above in conjunction with line 60 which is related to a battery in very good condition. Dashed line 64 represents a minimum voltage VM2 associated with the battery that is in worse condition than the batteries associated with lines 60 and 62.

The present invention takes advantage of the phenomena illustrated in FIG. 4, whereby the minimum voltage during the inrush event can be used to evaluate the condition of a battery each time that the battery is used to energize the starter motor. No new components or devices are necessary to perform the present invention. Instead, all that is needed is a measurement of the voltage in a dynamic manner that allows the magnitude of the voltage VI during inrush to be measured and stored. This magnitude can be compared to one or more threshold values to evaluate the condition of the battery. As an example, using the illustrations represented by lines 60, 62 and 64, three threshold values can be used to provide a simple implementation of the present invention. For example, if the magnitude of voltage VI is greater than 9.5 volts, the battery condition can be evaluated as being in top condition. If the magnitude of voltage VI is 9 volts or less, as represented by dashed line 62, the battery condition can be evaluated as being less than best condition, but acceptable. If the voltage VI during inrush is measured as being below 8 volts, the battery condition can be evaluated as being in a worse condition than that represented by lines 60 and 62. At some point, a minimum threshold value, such as 7 volts, is used to determine when a battery is in a condition that is no longer satisfactory for use. At that point, the operator would be warned that the battery should be inspected and/or replaced. It should be noted that all of these measurements are typically made during normal starting of the engine. The present invention is intended to provide advanced notification to the operator of a marine vessel as the battery begins to weaken, but is not yet severely degraded to represent a safety issue.

In one embodiment of the present invention, the values of the voltage magnitude VI, measured during the inrush current episode, are stored for sequential starting efforts. As the condition of the battery weakens, these magnitudes of voltage VI will indicate a trend toward lower values. As the sequence of magnitudes indicates changes from, for example, 10 volts to 9 volts to 8 volts, the trend line would indicate that a warning to the operator of the marine vessel should be issued. In this way, the operator of the marine vessel can examine or replace the battery before it actually demonstrates its weak condition by failing to start the engine. Of course, it should be clearly understood that the decrease in the minimum voltage VI measured during the inrush episode would be expected to change only slightly from one engine starting attempt to the next. Therefore, the decrease from approximately 10 volts to approximately 7 volts could extend over hundreds of starting procedures for the engine. In certain embodiments of the present invention, the trend information may consist of saving only one of the minimum voltage values VI for every five or ten starting attempts since the downward trend in the magnitude of VI, if it occurs, would be expected to be very gradual. It should be understood that the maintaining of trend information is not a requirement in all embodiments of the present invention.

With reference to FIGS. 1–4, it should be understood that several variations of the preferred embodiment of the present invention can be used to accomplish the goal of informing the operator of a marine vessel as the condition of the battery slowly degrades. For example, if the system does not interject the engine control module 12 into the actual starting procedure, as described above in conjunction with FIG. 1, various other techniques can be used to facilitate the monitoring of the battery voltage in order to measure the minimum voltage VI during inrush. In an application such as that illustrated in FIG. 2, where the engine control module 12 does not initiate the starting sequence, a signal could be provided from the key switch 24 that alerts the engine control module 12 when the operator has not only activated the key switch 24 but rotated the key in order to provide energy to the starter solenoid 18. Alternatively, the engine control module 12 can constantly monitor the rotational condition of the crankshaft of the engine 10, with a crank shaft position sensor 30, and respond to the initial rotation of the crankshaft by measuring or selecting the voltage VI which is the minimum magnitude. With reference to FIG. 3, it should be understood that initial rotation of the crankshaft of the engine 10 occurs after time T2 and most likely during the period T1. However, by the time the crankshaft actually begins to rotate, the minimum voltage VI at the time T2 has probably already occurred. Therefore, one ultimate method for performing the measuring step of the present invention and selecting the minimum voltage VI is to constantly measure the voltage as soon as the operator turns on the key switch 24 prior to the operator's turning the key for the purpose of activating the start solenoid 18. For example, the engine control module 12 can measure the voltage across the starter motor 16 or across the battery 20 every five milliseconds, or other convenient period of time, in order to detect the decrease in voltage that begins at time T1. If applicable, the microprocessor of the engine control module 12 can then begin to measure the voltage at a higher frequency in order to more accurately identify the minimum magnitude VI at time T2. Alternatively, the engine control module 12 can monitor the voltage at its maximum frequency beginning at the time the operator initially turns the key switch 24 on prior to rotating the key to energize the start solenoid 18. Another optional method for performing the steps of the present invention is to constantly monitor the voltage at all times and save a preselected number of these previously measured magnitudes. This continual saving of data could, for example, save two seconds worth of previously measured data at all times. Then, when the crankshaft of the engine 10 begins to turn, as measured by the crank shaft position sensor 30, the previously measured data can be examined to determine the minimum magnitude which would represent the magnitude VI at time T2. As can be seen, many different techniques can be employed to obtain the magnitude VI, which is the voltage of the battery during inrush and at its minimum magnitude.

With reference to FIGS. 1–4, the present invention measures a voltage characteristic 50 of the battery 20 during a first measuring event T2 which is subsequent to a connection event T1 when a connection relationship between the battery 20 and the electrical load 16 is changed. As described above, the connection event can be determined by the engine control module 12 if it is actively interjected into the starting procedure as in the system described above in conjunction with FIG. 1. Alternatively, the connection event can be detected indirectly by the engine-control-module 12 by monitoring the voltage magnitude which is graphically illustrated and identified by reference numeral 50 in FIG. 3 and reference numeral 60 in FIG. 4. Another indirect method of determining the connection event is to monitor the crank shaft position sensor 30 to determine when the crankshaft begins to rotate and then using that incident to interrogate previously obtained voltage magnitudes in order to select the minimum voltage VI that occurs during inrush. The connection event most likely consists of the change in a connection relationship between the battery and the electrical load which is from a disconnected state to a connected state. However, alternative embodiments of the present invention can be developed to react to changes in the connection relationship which change from a connected state to a disconnected state. For example, when the starter motor 16 is disconnected from the battery 20, such as at time T3, the charging system of the engine proceeds to charge the battery. By monitoring the voltage magnitude VC during the charging procedure, the condition of the battery can be assessed and evaluated. Although the precise procedure would be slightly different than the procedure described above, the basic steps of the present invention could be used to appropriately evaluate the condition of the battery under those circumstances.

The present invention then compares the voltage characteristic to a preselected threshold value. In a preferred embodiment of the present invention, the magnitude VI is compared to a table of preselected values of voltage that allows the present invention to not only determine whether or not the condition of the battery is acceptable or unacceptable but, in addition, it allows the present invention to actually grade the condition of the battery. In a preferred embodiment of the present invention, the table could typically comprise four or five values that divide the range from ten volts down to approximately six volts into several grades that allows the present invention to alert the operator, on a display device 40, of the most recently evaluated condition of the battery. These threshold values would typically be determined during a calibration procedure and would possibly be different for each engine type, depending on the type of starter motor, cranking characteristics and recommended battery size. These notifications can be accompanied by cautionary messages that may urge the operator to attend to the battery or have the battery examined in the near future.

After the voltage characteristic is compared to a preselected threshold value, the present invention evaluates the condition of the battery as a function of the relative magnitude of the voltage characteristic and the threshold value or values. This can be done by simply subtracting the threshold value from the voltage characteristic most recently measured and using the differential to grade the battery. In some applications, the voltage characteristic used by the present invention is a minimum voltage magnitude which is subsequent to the connection event. Alternatively, the voltage characteristic can be a voltage magnitude measured at a predetermined time which is subsequent to the connection event. In other words, if difficulty is encountered in precisely identifying the minimum magnitude VI at time T2, a time period can be determined empirically so that the voltage is measured at precisely that empirically derived time period following an easily identifiable event, such as the connection of the starter motor 16 at time T1. This technique of using a preselected and empirically derived time period to make the measurement is less preferred than actually measuring and calculating the minimum voltage VI, but it can be used to accomplish the purpose of the present invention. Alternatively, the voltage characteristic can be a voltage magnitude which is measured subsequent to a minimum voltage magnitude VI which is subsequent to the connection event T1.

In a preferred embodiment of the present invention, the electrical load is a starter motor 16 and the starter motor is connected in torque transferring relation with an internal combustion engine 10.

In some embodiments of the present invention, the method further comprises the step of initiating the connection event. This additional step is most likely in a system, such as that illustrated in FIG. 1, where the engine control module 12 is interjected into the actual starting sequence of the engine 10. For example, when the operator activates the start switch 24, the helm control module 14 communicates this act to the engine control module 12. At this point, the actuation of the key switch 24 did not directly cause the starter motor 12 to be activated. Instead, it indirectly caused the helm control module 14 to provide a signal on the CAN bus 38 to the engine control module 12 signifying that the operator wishes to start the engine. At that point, the engine control module 12 is in total control of the starting procedure. It then energizes the starter solenoid 18 which provides power to the starter motor 16. Under this circumstance, the engine control module 12 can precisely determine the moment when the starter motor 16 is energized at time T1. In this embodiment of the present invention, the method performed by the engine control module 12 comprises the step of initiating the connection event. In alternative embodiments, the present invention determines the occurrence of the connection event without actually having initiated the connection event. As described above, this is done by either observing changes in the voltage of the battery 20 or signals provided by the crank shaft position sensor 30 which indicates that the crankshaft has begun to rotate. As discussed above, the voltage characteristic of the battery 20 can be measured directly across the two electrodes, 41 and 42, of the battery 20 or across the connections of the starter motor 16 which are connected to the battery 20 when the starter solenoid 18 is energized.

As described above, the connection relationship between the battery and the load can be changed from being disconnected to being connected. The results of the measuring the battery voltage and determining the minimum magnitude VI, in a preferred embodiment of the present invention, are stored for a plurality of subsequent magnitudes of the voltage characteristic obtained during subsequent measuring events. This allows the present invention to store a table of values that can be used to determine a trend and, in addition, can be used to predict a future time when the battery condition may decrease to a value which is less than desirable. At that point, warning messages and informational messages can be provided to the operator of the marine vessel that the battery condition should be checked and, possibly, that the battery should be replaced. The threshold values can be selected to provide various gradations of battery condition which could range from the best condition to a worst condition.

Although the present invention has been described in particular detail and illustrated to show a preferred embodiment, it should be understood that alternative embodiments are also within its scope.

I claim:

1. A method for monitoring a condition of a battery which is connectable to an electrical load, comprising the steps of:
    measuring a voltage characteristic of said battery during a measuring event subsequent to a connection event when a connection relationship between said battery and said electrical load is changed;
    storing a plurality of said measured voltage characteristics for a plurality of subsequent magnitudes of said measured voltage characteristics obtained during subsequent measuring events;
    providing a table of a plurality of pre-selected voltage values, including a threshold acceptability voltage value and a plurality of gradation voltage values;
    comparing said measured voltage characteristic to all three of the following:
        a) said pre-selected threshold acceptability voltage value;
        b) said pre-selected plurality of gradation voltage values;
        c) said stored plurality of measured voltage characteristics of said subsequent magnitudes;
    providing all three of the following in combination:
        1) an indication of whether the condition of the battery is acceptable, according to said pre-selected threshold acceptability voltage value;
        2) an indication of the grade of battery condition, according to said pre-selected plurality of gradation voltage values;
        3) an indication of the trend of battery condition grade, according to said plurality of measured voltage characteristics.

2. The method according to claim 1 comprising using said indication of said trend of battery condition grade, according to said plurality of measured voltage characteristics, to predict a future time when said measured voltage characteristic becomes less than said pre-selected threshold acceptability voltage value whereupon the condition of the battery becomes unacceptable.

3. The method according to claim 1 wherein said measured voltage characteristic is a minimum voltage magnitude which is subsequent to said connection event.

4. The method according to claim 1 wherein said measured voltage characteristic is a voltage magnitude measured at a pre-determined time which is subsequent to said connection event.

5. The method according to claim 1 wherein said measured voltage characteristic is a voltage magnitude measured subsequent to a minimum voltage magnitude which is subsequent to said connection event.

* * * * *